(12) United States Patent
Zhong et al.

(10) Patent No.: US 11,837,590 B2
(45) Date of Patent: Dec. 5, 2023

(54) DISPLAY PANEL, MANUFACTURING METHOD THEREOF, AND DISPLAY DEVICE

(71) Applicant: WUHAN CHINA STAR OPTOELECTRONICS TECHNOLOGY CO., LTD., Hubei (CN)

(72) Inventors: Li Zhong, Hubei (CN); Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 681 days.

(21) Appl. No.: 17/041,042

(22) PCT Filed: Jul. 21, 2020

(86) PCT No.: PCT/CN2020/103153
§ 371 (c)(1),
(2) Date: Sep. 24, 2020

(87) PCT Pub. No.: WO2021/253558
PCT Pub. Date: Dec. 23, 2021

(65) Prior Publication Data
US 2021/0398960 A1    Dec. 23, 2021

(51) Int. Cl.
*H01L 25/16*    (2023.01)
*G06V 40/13*    (2022.01)
(Continued)

(52) U.S. Cl.
CPC ........ *H01L 25/167* (2013.01); *G06V 40/1318* (2022.01); *G06V 40/1359* (2022.01);
(Continued)

(58) Field of Classification Search
CPC .......................... H01L 25/167; H01L 25/0753
See application file for complete search history.

(56) References Cited

U.S. PATENT DOCUMENTS

2017/0172432 A1    6/2017    Liou et al.
2020/0219820 A1*   7/2020    Chen ..................... H01L 27/156
(Continued)

FOREIGN PATENT DOCUMENTS

CN    106502060 A    3/2017
CN    206400216 U    8/2017
(Continued)

*Primary Examiner* — Wasiul Haider
(74) *Attorney, Agent, or Firm* — PV IP PC; Wei Te Chung; Zhigang Ma

(57) ABSTRACT

A display panel, a manufacturing method thereof, and a display device are provided. The display panel includes a driving backplate, functional component groups, and micro-LED chips. The functional component groups are integrated in regions where the micro-LED chips are not disposed and are multiplexed as alignment marks. In a mass transfer process of the micro-LED chips, the alignment marks are prevented from additionally occupying pixel space by using part of functional components multiplexed as the alignment marks under a precondition of ensuring alignment accuracy.

20 Claims, 9 Drawing Sheets

(51) Int. Cl.
  *H01L 33/52* (2010.01)
  *G06V 40/12* (2022.01)
(52) U.S. Cl.
  CPC .......... *G06V 40/1365* (2022.01); *H01L 33/52* (2013.01); *H01L 2933/005* (2013.01)

(56) References Cited

U.S. PATENT DOCUMENTS

| | | |
|---|---|---|
| 2021/0109570 A1 | 4/2021 | Wu et al. |
| 2021/0109624 A1 | 4/2021 | Lee et al. |

FOREIGN PATENT DOCUMENTS

| | | |
|---|---|---|
| CN | 108269786 A | 7/2018 |
| CN | 108668426 A | 10/2018 |
| CN | 109523943 A | 3/2019 |
| CN | 109830191 A | 5/2019 |
| CN | 110571254 A | 12/2019 |
| CN | 111160287 A | 5/2020 |

\* cited by examiner

DISPLAY PANEL, MANUFACTURING METHOD THEREOF, AND DISPLAY DEVICE

FIELD OF INVENTION

The present disclosure relates to the field of display technology, and particularly relates to a display panel, a manufacturing method thereof, and a display device.

BACKGROUND OF INVENTION

With development of micro light emitting diode (micro-LED) technology, dimensions of micro-LED chips are manufactured increasingly smaller, pixels per inch (PPI) of corresponding micro-LED display devices able to be manufactured thereof are increasingly higher, pitches between the micro-LED chips on driving backplates are increasingly smaller, and a number of the micro-LED chips is increasingly greater. In current mass transfer technology, a transfer area is about one inch, and completely manufacturing one screen usually needs a plurality of repeated transfer processes. Furthermore, in the transfer processes, alignment marks need to be designed on the driving backplates in advance to ensure transfer accuracy. However, configuration of the alignment marks can additionally occupy space of display pixels.

Therefore, the problem of the alignment marks additionally occupying the space of the display pixels in current micro-LED display screens needs to be solved.

SUMMARY OF INVENTION

The present disclosure provides a display panel, a manufacturing method thereof, and a display device to ease the technical problem of the alignment marks additionally occupying the space of the display pixels in the current micro-LED display screens.

In order to solve the problems mentioned above, the present disclosure provides following technical solutions.

One embodiment of the present disclosure provides a display panel, including a plurality of subpixel units and functional component groups. The functional component groups are disposed between adjacent subpixel units. A function of the functional component groups is different from a function of the subpixel units. Furthermore, the functional component groups include first functional components, and the first functional components are multiplexed as first alignment marks.

In the display panel provided by one embodiment of the present disclosure, each of the subpixel units includes micro light emitting diode (micro-LED) chips, and the functional component groups are disposed between two adjacent micro-LED chips.

In the display panel provided by one embodiment of the present disclosure, part of the first functional components are multiplexed as the first alignment marks.

In the display panel provided by one embodiment of the present disclosure, the functional component groups further include second functional components adjacent to the first functional components, and a function of the second functional components is different from a function of the first functional components.

In the display panel provided by one embodiment of the present disclosure, the second functional components are multiplexed as second alignment marks.

In the display panel provided by one embodiment of the present disclosure, shapes of the second functional components are different from shapes of the first functional components.

In the display panel provided by one embodiment of the present disclosure, the shapes of the first alignment marks and the second alignment marks include one or more of a circle, a rectangular shape, or a cross shape, or combinations thereof.

In the display panel provided by one embodiment of the present disclosure, diameters or edges of the first alignment marks and the second alignment marks are respectively greater than 30 μm.

In the display panel provided by one embodiment of the present disclosure, the second functional components and the first functional components are multiplexed as the first alignment marks.

In the display panel provided by one embodiment of the present disclosure, each of the first functional components and the second functional components includes one functional component of a fingerprint recognition sensor, a palmprint recognition sensor, an energy storage capacitor, or an antenna.

In the display panel provided by one embodiment of the present disclosure, the display panel further includes a driving backplate and an encapsulation layer. The micro-LED chips are bound on the driving backplate. The encapsulation layer is covered on the micro-LED chips. The driving backplate is divided into a plurality of partitions. Each of the partitions includes the plurality of subpixel units.

In the display panel provided by one embodiment of the present disclosure, at least two of the first functional components in each of the partitions are multiplexed as the first alignment marks.

In the display panel provided by one embodiment of the present disclosure, the at least two of the first functional components are located on diagonal sides of the partition.

In the display panel provided by one embodiment of the present disclosure, shapes of the at least two of the first functional components are different.

One embodiment of the present disclosure provides a manufacturing method of the display panel, including following steps: providing a driving backplate, wherein the driving backplate is divided into a plurality of partitions, functional component groups are disposed in each of the partitions, the functional component groups include first functional components, part of the first functional components are multiplexed as first alignment marks, and shapes of the first alignment marks are different from shapes of another part of the first functional components; providing a transfer substrate disposed with micro-LED chips, taking the first alignment marks as references to transfer the micro-LED chips into each of the partitions by stages, and binding the micro-LED chips to the driving backplate; peeling off the transfer substrate; and manufacturing an encapsulation layer on the micro-LED chips and the first functional components.

In the manufacturing method of the display panel provided by one embodiment of the present disclosure, at least two of the first functional components in each of the partitions are multiplexed as the first alignment marks, at least two of the first functional components are disposed on diagonal sides of the partition, and shapes of at least two of the first functional components are different.

One embodiment of the present disclosure provides a display device, including a display panel, and the display panel includes a plurality of subpixel units and functional component groups. The functional component groups are disposed between adjacent subpixel units. A function of the functional component groups is different from a function of the subpixel units. Furthermore, the functional component groups include first functional components, and the first functional components are multiplexed as first alignment marks.

In the display device provided by one embodiment of the present disclosure, the functional component groups further include second functional components adjacent to the first functional components, and a function of the second functional components is different from a function of the first functional components.

In the display device provided by one embodiment of the present disclosure, the second functional components are multiplexed as second alignment marks.

In the display device provided by one embodiment of the present disclosure, the second functional components and the first functional components are multiplexed as the first alignment marks.

In the display panel, the manufacturing method thereof, and the display device provided by the present disclosure, beneficial effect of the present disclosure is that the functional component groups are integrated into the subpixel units, improving integration of the display panel. Furthermore, the shapes of part of the functional components are made into shapes of the alignment marks, realizing multiplexing of mass transfer alignment marks, and other functional components not multiplexed as the marks are kept in a maximized area design. Therefore, there is no need to occupy additional pixel space for independently manufacturing the mass transfer alignment marks, which can ensure areas of the functional components to be maximized. Moreover, design degree of freedom of each display subpixel units can be increased, which is conducive to increasing space of the subpixel units, thereby realizing high PPI display.

DESCRIPTION OF DRAWINGS

In order to more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which those skilled in the art can derive further figures without making any inventive efforts.

DETAILED DESCRIPTION OF PREFERRED EMBODIMENTS

Figure 1:
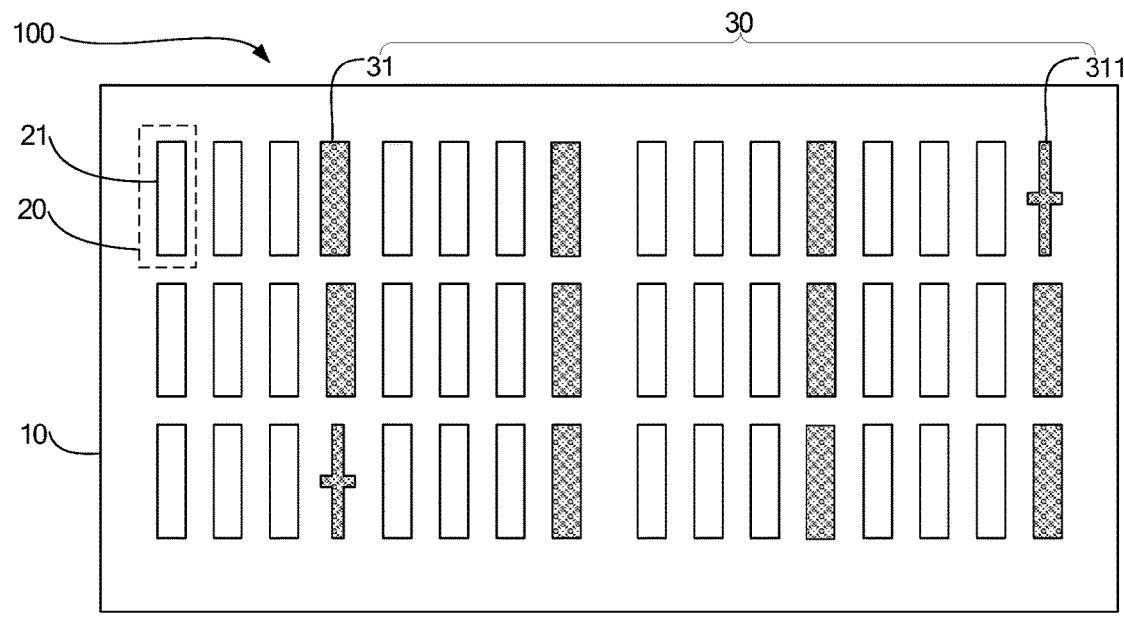
FIG. 1 is a first structural bottom view of a display panel provided by one embodiment of the present disclosure.

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., only refer to directions of the accompanying figures. Therefore, the used directional terms are for illustrating and understanding the present disclosure, but not for limiting the present disclosure. In the figures, units with similar structures are indicated by the same reference numerals.

In one embodiment, a display panel 100 is provided. As illustrated in FIG. 1, the display panel 100 includes a driving backplate 10, a plurality of subpixel units 20, and functional component groups 30. The plurality of subpixel units 20 are disposed on the driving backplate 10, and the functional component groups 30 are disposed between the adjacent subpixel units 20. A function of the functional component groups 30 is different from a function of the subpixel units 20. Furthermore, the functional component groups 30 include first functional components 31, and the first functional components 31 are multiplexed as first alignment marks.

Specifically, each of the subpixel units 20 includes a micro light emitting diode (micro-LED) chip 21. The micro-LED chip 21 is bound on the driving backplate 10.

The functional component groups 30 are disposed between two adjacent micro-LED chips 21 and on the driving backplate 10.

Furthermore, a function of the functional component groups 30 is different from a function of the subpixel units 20. Specifically, a main function of the subpixel units 20 is a display function, that is, providing pixels for display of the display panel. The function of the functional component groups 30 is a non-display function, for example, it can be other non-display functions such as realizing fingerprint recognition, etc.

Furthermore, widths and lengths of the micro-LED chips 21 range from 1 μm to 100 μm, and heights of the micro-LED chips 21 range from 1 μm to 20 μm.

Specifically, part of the first functional components 31 are multiplexed as first alignment marks. Shapes of the first functional components multiplexed as the first alignment marks are different from shapes of the first functional components not multiplexed as the first alignment marks, that is, shapes of the first alignment marks are different from shapes of another part of the first functional components.

Specifically, as illustrated in FIG. 1, part of the first functional components 31 are multiplexed as the first alignment mark 311. The first alignment marks 311 are configured as cross shapes, and the first functional components 31 not multiplexed as the first alignment marks 311 are configured as rectangular shapes.

Furthermore, the shapes of the first alignment marks 311 can also be one or more other mark shapes such as a circle, a rectangular shape, or combinations thereof.

Furthermore, diameters or edges of the first alignment marks 311 are greater than 30 μm.

Furthermore, the first functional components 31 can be at least one of functional component such as a fingerprint recognition sensor, a palmprint recognition sensor, an energy storage capacitor, or an antenna, etc.

Furthermore, a number of the first alignment mark 311 is at least two. Two of the first alignment marks 311 are disposed on diagonal sides of the driving backplate to satisfy accurate alignment during transferring the micro-LED chips to the driving backplate.

Furthermore, shapes of two of the first alignment marks 311 can be same or different. When the two first alignment marks 311 are different, alignment accuracy can be improved.

Of course, the number of the first alignment marks can be more. For example, all of the first functional components can be configured as mark shapes to be multiplexed as the first alignment marks.

In this embodiment, by multiplexing the first functional components as the alignment marks, there is need to occupy additional pixel space for independently manufacturing the mass transfer alignment marks, and integration of the first functional components is not affected.

Figure 2:
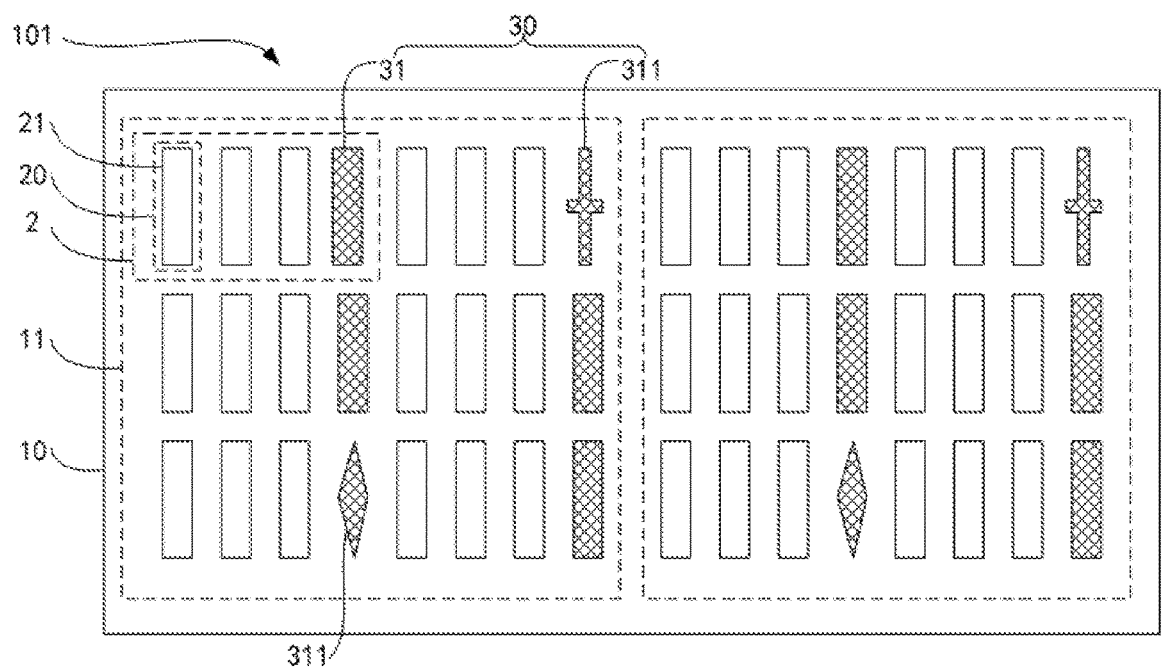
FIG. 2 is a second structural bottom view of the display panel provided by one embodiment of the present disclosure.
Figure 3:
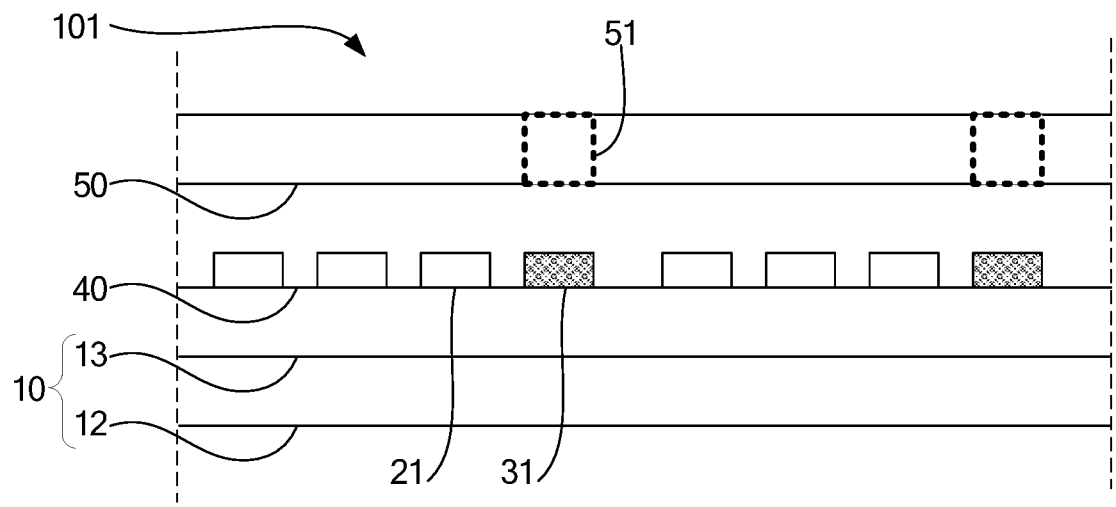
FIG. 3 is a second structural lateral view of the display panel provided by one embodiment of the present disclosure.

In one embodiment, a display panel 101 is provided. Please refer to FIG. 2 and FIG. 3, the display panel 101 includes a driving backplate 10, a plurality of subpixel units 20, functional component groups 30, and an encapsulation layer 40. The driving backplate 10 is divided into a plurality of partitions 11. The plurality of subpixel units 20 are distributed in each of the partitions 11. Each of the subpixel units 20 includes one micro-LED chip 21. The micro-LED chips 21 are bound on the driving backplate 10. The functional component groups 30 are disposed on the driving backplate 10 and between two adjacent micro-LED chips 21. A function of the functional component groups 30 is different from a function of the subpixel units 20. Furthermore, the functional component groups 30 include first functional components 31, and part of the first functional components 31 are multiplexed as first alignment marks 311. As illustrated in FIG. 3, the encapsulation layer 40 is disposed on the micro-LED chips 21 and the functional component groups 30. Furthermore, as illustrated in FIG. 2, shapes of the first alignment marks 311 are different from shapes of the first functional components 31 not multiplexed as the first alignment marks.

Specifically, the first functional components 31 can be a fingerprint recognition sensor, or a palmprint recognition sensor for implementation of fingerprint recognition or palmprint recognition. In order to realize the fingerprint recognition or the palmprint recognition, as illustrated in FIG. 3, the display panel 101 further includes a light path layer 50 disposed on the encapsulation layer 40; a light transmissive region 51 is disposed on the light path layer 50; and the light transmissive region 51 corresponds to the first functional component 31. Furthermore, the light path layer 50 is configured to collimate light reflected from fingers to improve contrast of collected fingerprint images.

Specifically, taking the first functional components 31 as a fingerprint recognition sensor as an example for description, the fingerprint recognition sensor is disposed on the driving backplate 10, and the driving backplate 10 is divided into the plurality of partitions 11. Each of the partitions 11 includes the plurality of subpixel units 20, and every three subpixel units 20 constitute a pixel 2. The fingerprint recognition sensors can be disposed between part or all adjacent subpixel units 20, that is, the fingerprint recognition sensors are disposed on regions of each of the pixels 2 where the micro-LED chip 21 is not disposed. Two partitions 11 and part of the subpixel units 20 of each partition 11 are exemplarily illustrated in FIG. 2, and one fingerprint recognition sensor is disposed in each pixel 2. Of course, the fingerprint recognition sensors are disposed between all adjacent subpixel units 20, which can realize large area of fingerprint recognition, and experience of fingerprint unlock can be freer and more convenient, improving user experience.

Figure 4:
FIG. 4 is a PIN structural schematic diagram of a fingerprint recognition sensor provided by one embodiment of the present disclosure.

Specifically, a PIN structure such as amorphous silicon (a-Si), low-temperature polycrystalline-silicon (LTPS), organic photo diodes (OPDs, optoelectronic diodes constituted by organic material), etc. can be used to realize the fingerprint recognition sensor. A PIN structure of the fingerprint recognition sensor as illustrated in FIG. 4 includes a cathode 3111, an electron transport layer 3112, an intrinsic active layer 3113, a hole transport layer 3114, and an anode 3115.

Furthermore, shapes the fingerprint recognition sensors multiplexed as the first alignment marks are different from shapes of the fingerprint recognition sensors not multiplexed as the first alignment marks, that is, as illustrated in FIG. 2, the shapes of the first alignment marks 311 are different from shapes of the first functional components 31 not multiplexed as the first alignment marks.

Specifically, the shapes of the first alignment marks 311 include one or more of mark shapes such as a circle, a rectangular shape, a cross shape, or combinations thereof. The shapes of first functional components 31 not multiplexed as the first alignment marks can be rectangular shapes, etc.

Furthermore, diameters or edges of the first alignment marks 311 are greater than 30 μm.

Specifically, as illustrated in FIG. 2, at least two first functional components are multiplexed as the first alignment marks 311 in each partition 11. Wherein two of the first alignment marks 311, that is the two first functional components multiplexed as the first alignment marks 311, are disposed on two diagonal sides of the partition 11, and the two first alignment marks 311 are symmetrical about a center of the partition 11. Of course, the first alignment mark 311 can also be disposed on other regions of the partitions 11, where can meet alignment requirements.

Furthermore, the shapes of the first alignment marks 311 are different from shapes of the first functional components 31 not multiplexed as the first alignment marks, and shapes of the two first alignment marks 311 are also different. Specifically, configuring the shapes of the two first alignment marks 311 into different cross shapes or rectangular shapes can improve alignment accuracy during acting as alignment marks. The shapes of first functional components 31 not multiplexed as the first alignment marks are configured as rectangular shapes for collocating with light path to improve imaging effect.

Specifically, each of the pixels 2 includes three micro-LED chips 21, which are respectively micro-LED chips with three primary colors of red, green, and blue, configured as display of the display panel. Regions disposed with the micro-LED chip 21 are display regions of the pixels 2, that is, each of the pixels 2 includes three display subpixel units 20 with red, green, and blue colors. Arrangement of the display subpixel units 20 can be a strip shape, a delta shape, and a backup design or a non-backup design can be used on the pixels. Of course, the three micro-LED chips 21 of each pixel 2 can be micro-LED chips with a same color, and can be coordinated with quantum dot layers or fluorescent powders to realize display of three primary colors.

It should be noted that the pixels 2 of the present disclosure are not limited to using three primary colors of red, green, and blue (RGB) to display, and four pixels with red, green, blue, and white (RGBW) colors can also be used. When the four pixels with RGBW colors are used, each of the pixels includes four micro-LED chips.

Figure 5:
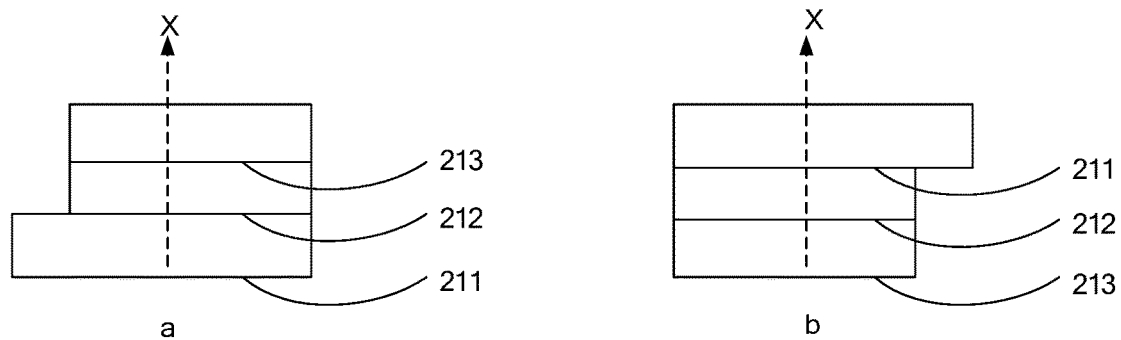
FIG. 5 is a schematic diagram of light emission directions of micro light emitting diode (micro-LED) chips provided by one embodiment of the present disclosure.

Furthermore, the micro-LED chips 21 can be structures of light emission from a bottom surface or light emission from an electrode surface. A micro-LED chip structure illustrated in FIG. 5 includes a substrate 211, a light emitting layer 212, and an electrode layer 213. Illustrated in "a" of FIG. 5 is the structure of light emission from the electrode surface, and illustrated in "b" of FIG. 5 is the structure of light emission from the bottom surface. A dotted line X with an arrow in FIG. 5 indicates a light emission direction.

Furthermore, the micro-LED chips 21 are transferred and bound to the driving backplate 10 by technology such as mass transfer, etc. As illustrated in FIG. 3, the driving backplate 10 includes a base 12 and a driving circuit layer 13 disposed on the base 12. The driving circuit layer 13 includes a driving circuit (not shown in the figure) configured to drive the micro-LED chips 21 and a driving circuit (not shown in the figure) configured to drive the fingerprint recognition sensors. Active matrix driving technology or passive matrix driving technology based on a-Si, LTPS, indium gallium zinc oxide (IGZO), etc. is used in the driving circuit for implementation.

Specifically, in a situation of the display panel with large display region, in order to ensure display effect of the micro-LED, the driving circuit of the micro-LED chips 21 can be realized by using active matrix (AM) driving technology.

Specifically, the active or the passive matrix driving methods can be used on the driving circuit of the fingerprint recognition sensor, wherein a three-transistor (3T) or four-transistor (4T) driving structure is usually used to enlarge a photo-generated voltage in biology signals by utilizing voltage generated by a photo-generated current in the active one, and a one-transistor (1T) or two-transistor (2T) driving structure is usually used to directly utilize integral of the photo-generated current generated from the fingerprint recognition sensors in a certain time as biology recognition signals in the passive one.

Specifically, the display panel 101 includes a substantial number of the micro-LED chips 21, and all the micro-LED chips need to be transferred and bound on the driving backplate 10 by many times of mass transfer. The time of the mass transfer is equal to a number of the partitions on the driving backplate 10. Dimensions of lengths and widths of the partitions 11 range from 2 centimeters to 3 centimeters, and the dimensions of each partition 11 are same, which is conducive to using a uniform method for alignment, transfer, and binding, thereby simplifying manufacturing processes.

Specifically, when performing mass transfer to each partition 11, the first alignment mark 311 in each partition 11 is configured as a reference to transfer and to bind the micro-LED chips 21 to the driving backplate 10 of the corresponding partition 11.

Furthermore, after completing the mass transfer of all the partitions 11, a layer of encapsulation layer 40 is manufactured on the micro-LED chips 21 and the fingerprint recognition sensor. The encapsulation layer 40 is a high level difference absorbing encapsulation layer configured to balance level differences between each of the micro-LED chips 21 while protecting the micro-LED chips 21 to prevent intrusion of water/oxygen.

In this embodiment, the fingerprint recognition is integrated on the non-display regions of the pixel units. Light emitted from the micro-LED chips in the pixel units is reflected to the fingerprint recognition sensors by fingerprints, and optoelectronic response signals from differences of ridges and valleys of the fingerprints can be generated. The fingerprint recognition function can be implemented by combining pre-processing of the fingerprint signals, extracting characteristic points, and comparing algorithm modules to perform fingerprint recognition verification. When the fingerprint recognition is not needed, the micro-LED chips emit light to realize full-color display. Meanwhile, the shapes of part of the fingerprint recognition sensors are made into shapes of the alignment marks, realizing multiplexing of the fingerprint recognition sensors and mass transfer alignment marks, and other fingerprint recognition sensors not multiplexed as the marks are kept in a design with maximized area. Therefore, there is no need to occupy additional pixel space for independently manufacturing the mass transfer alignment marks, which can ensure areas of the fingerprint recognition sensors to be maximized.

In one embodiment, difference from the above mentioned embodiments is that the functional component groups further include second functional components adjacent to the first functional components, and the second functional components and the functional component are different functional components, that is, a function of the second functional components is different from a function of the first functional components.

Specifically, the second functional component can also be one functional component such as a fingerprint recognition sensor, a palmprint recognition sensor, an energy storage capacitor, or an antenna, etc., but is different from the first functional components.

Specifically, taking the first functional component 31 as the fingerprint recognition sensor and the second functional component 32 as an energy storage capacitor as an example for description. According to the display panel 102 illustrated in FIG. 6, the functional component groups 30 include the first functional component 31 and the second functional component 32. The first functional component 31 and the second functional component 32 are disposed between corresponding adjacent subpixel units 31 together, where is the non-display region of the pixels 2. One fingerprint recognition sensor and one energy storage capacitor are disposed in each pixel 2.

Specifically, the functional component group 30 is disposed between two rows of adjacent pixels 2. Each pixel 2 includes three subpixel units 20. Each subpixel unit 20 includes one micro-LED chip 21. The functional component group 30 is disposed on a region in the pixels 2 where no micro-LED chip 21 is disposed.

Furthermore, part of the first functional components 31 are multiplexed as first alignment marks 311. The shapes of the first alignment marks 311 are different from shapes of the first functional components 31 not multiplexed as the first alignment marks and shapes of the second functional components 32.

Figure 6:
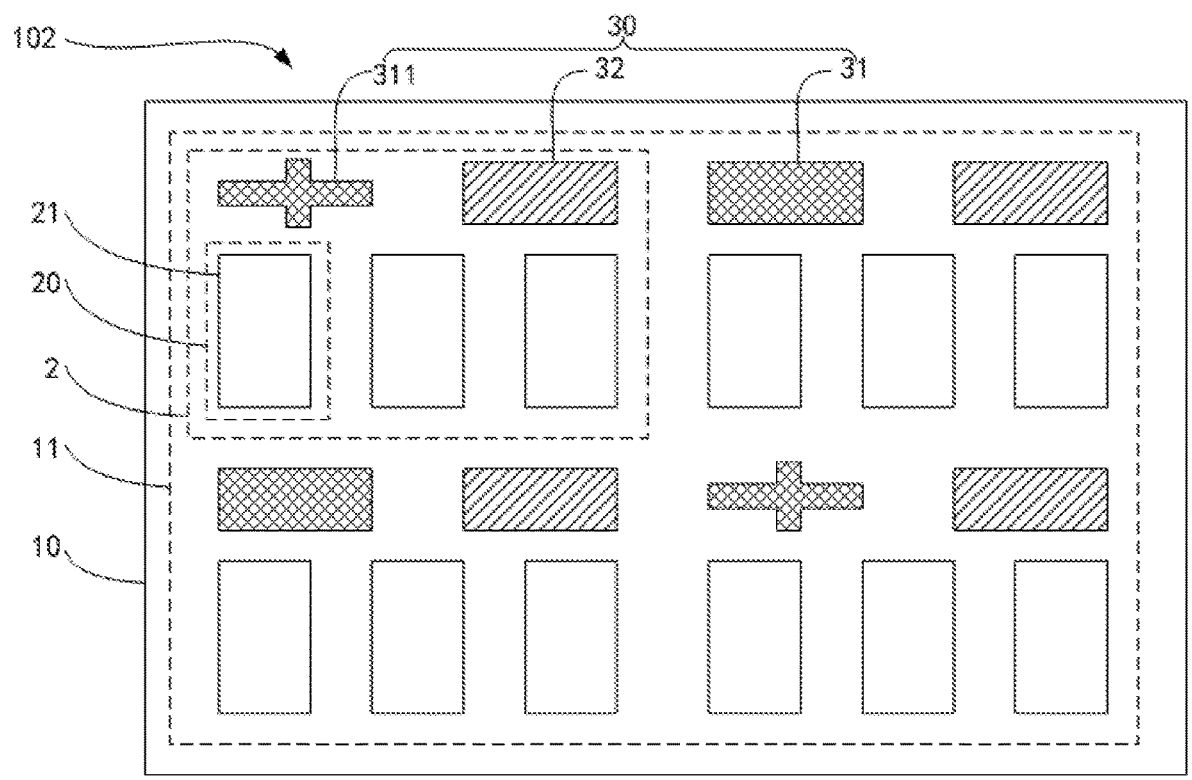
FIG. 6 is a third structural bottom view of the display panel provided by one embodiment of the present disclosure.

Specifically, as illustrated in FIG. 6, at least two first alignment marks 11 are disposed in each partition 11 (one of the partitions 11 on the backplate 10 is exemplarily illustrated in FIG. 6). The first alignment marks 311 are the fingerprint recognition sensors and are multiplexed as the alignment marks at same time. The shapes of the first alignment marks 311 are cross shapes, and of course they can be configured to be other mark shapes. The shapes of the first functional components 31 not multiplexed as the first alignment marks and the second functional components 32 are rectangular shapes.

Furthermore, the first alignment marks 311 are disposed on two diagonal sides of the partition 11, and the two first alignment marks 311 are symmetrical about a center of the partition 11. Of course, the first alignment marks 311 can also be disposed on other regions of the partitions, where can meet alignment requirements.

Furthermore, shapes of the two first alignment marks 311 can be configured into different shapes.

Specifically, the energy storage capacitor can be a plate capacitor structure with one layer or a plurality of layers. A material of a dielectric layer of the energy storage capacitor includes inorganic materials such as silicon nitride (SiNx), silica (SiOx), etc., or a ceramics material such as barium titanate, strontium titanate, or a metal such as tantalum, etc.

Furthermore, the energy storage capacitor is connected to a peripheral charging electric circuit by a corresponding electric circuit, and can be charged synchronously in a state that the display pixels is powered on and display, after the power is off, can supply power to different subpixel units in the display pixel by an electric charge converting unit, thereby serving as an usage of an energy storage battery with a certain function, and improving battery life of the display system.

Furthermore, in order to increase capacitance of the energy storage capacitor and prevents influence of capacitor signals to the driving circuit of the subpixel units, the energy storage capacitor is disposed on regions outside the subpixel units and the driving circuit. Moreover, shapes of the energy storage capacitor can be any arbitrary notch shapes to maximize capacitance of the energy storage capacitor.

In this embodiment, the fingerprint recognition sensor and the energy storage capacitor are integrated in the pixels at the same time, and part of the fingerprint recognition sensors are designed into the mark shape and multiplexes as the alignment marks during mass transfer. The fingerprint recognition sensors and the energy storage capacitors are disposed on locations of the non-display regions of the pixel units, and disposing manner and shapes are not limited by the embodiments of the present disclosure. For other descriptions, please refer to the embodiments mentioned above, and redundant description will not be mentioned herein again.

In one embodiment, a difference from the embodiment mentioned above is that the first functional components are multiplexed as the first alignment marks, and the second functional components are multiplexed as the second alignment marks. The shapes of the second alignment marks are different from the shapes of the first functional components.

Figure 7:
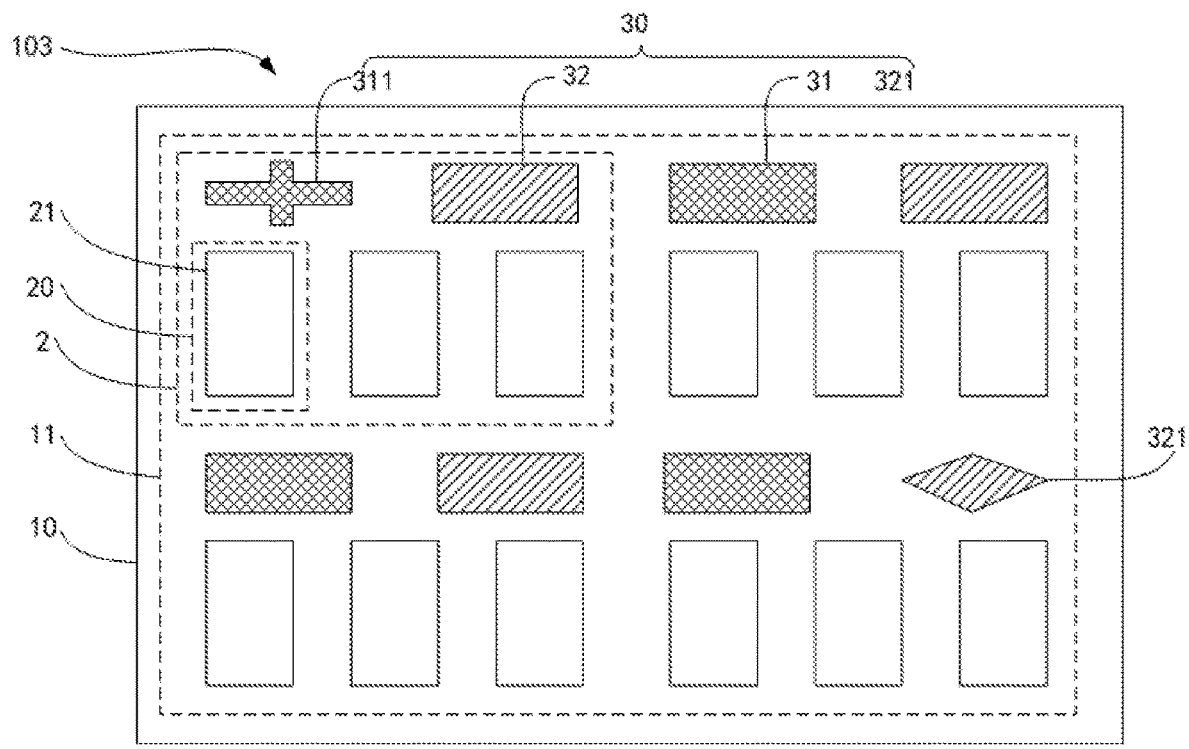
FIG. 7 is a fourth structural bottom view of the display panel provided by one embodiment of the present disclosure.

Specifically, in the display panel 103 illustrated in FIG. 7, part of the second functional components 32 are multiplexed as the second alignment marks 321. In the partitions 11 of the driving backplate 10, at least one first alignment mark 311 and second alignment mark 321 are disposed. The first functional component 31 can be the fingerprint recognition sensor and is multiplexed as the first alignment mark simultaneously. The second functional component 32 can be the energy storage capacitor and can be multiplexed as the second alignment mark simultaneously.

Specifically, the first alignment marks 311 and the second alignment marks 321 are disposed on the two diagonal sides of the partition 11. Of course, the first alignment marks 311 and the second alignment marks 321 can also be disposed on other regions of the partitions 11, where can meet alignment requirements.

Furthermore, the shapes of the second alignment marks 321 and the shapes of the first functional components 31 are different, and the shapes of the second alignment marks 321 are different from the shapes of the second functional components 32 not multiplexed as the second alignment marks. As illustrated in FIG. 7, the shapes of the second alignment marks 321 are rectangular shapes, and the shapes of the first alignment marks 311 are cross shapes. Of course, the shapes of the first alignment marks 311 and the second alignment marks 321 are not limited thereto, they can also be other mark shapes. The shapes of the first alignment marks 311 and the second alignment marks can also be same. The first functional components 31 not multiplexed as the first alignment marks and the second functional components 32 not multiplexed as the second alignment marks are configured in regular shapes, such as rectangular shapes, etc.

Specifically, the shapes of the second alignment marks 321 include other mark shape of one or more of a circle, a rectangular shape, a cross shape, or combinations thereof.

Furthermore, diameters or edges of the second alignment marks 321 are greater than 30 μm.

It can be understood that all the second functional components can be multiplexed as the second alignment marks, and the shapes of the second functional components and the shapes of the first functional components are different. For other descriptions, please refer to the embodiments mentioned above, and redundant description will not be mentioned herein again.

Figure 8:
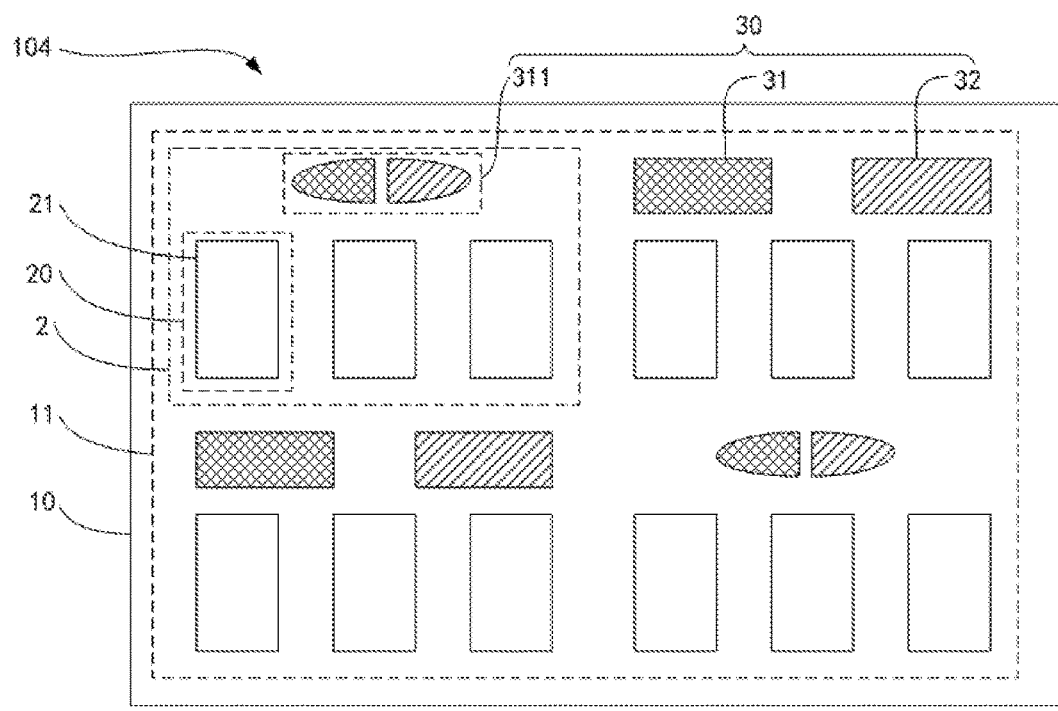
FIG. 8 is a fifth structural bottom view of the display panel provided by one embodiment of the present disclosure.

In one embodiment, a difference from the embodiment mentioned above is that the first functional components and the second functional components are multiplexed as the first alignment mark together. In the display panel 104 as illustrated in FIG. 8, part of the second functional components and the first functional components are multiplexed as the first alignment marks 311 together. The shapes of the first functional components and the second functional components multiplexed as the first alignment marks 311 are semi-circular shapes, and the two semi-circular shapes compose an approximate circle to act as the first alignment mark 311. The other first functional components 31 and second functional components 32 not multiplexed as the first alignment marks are configured into regular shapes such as rectangular shapes. For other descriptions, please refer to the embodiments mentioned above, and redundant description will not be mentioned herein again.

It should be noted that the functional component groups of the present disclosure are not limited as illustrated in the embodiments of the present disclosure. The functional component groups of the present disclosure can further include the fingerprint recognition sensors, the palmprint recognition sensors, or combinations with other functional components, such as combinations with various antennas, storage units, etc. Furthermore, the functional components multiplexed as the alignment marks are not limited to illustrated in the embodiments of the present disclosure, and the number of the alignment marks and disposing positions are not limited as illustrated in the figures of the present disclosure, and will not be described in details herein again.

In one embodiment, a manufacturing method of the display panel is provided, which includes following steps.

Figure 9:
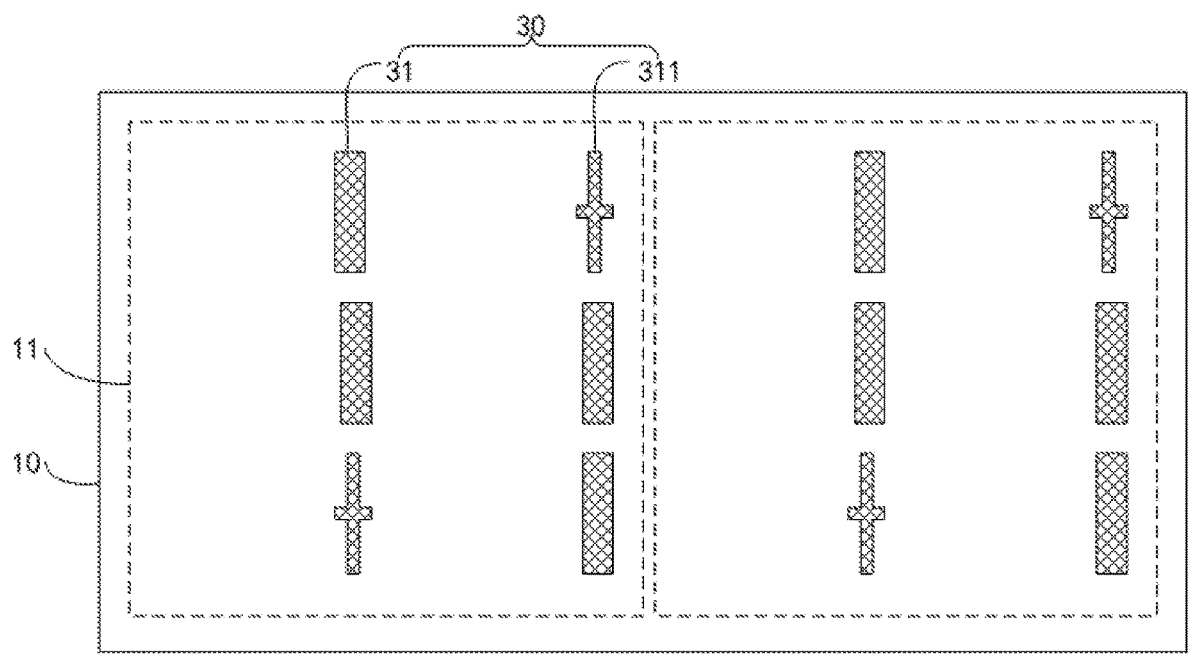
FIGS. 9 to 17 are structural schematic diagrams in each step of a manufacturing method of the display panel provided by one embodiment of the present disclosure.

Step S10, providing a driving backplate, as illustrated in FIG. 9, wherein the driving backplate 10 is divided into the plurality of partitions 11, the functional component groups 30 are disposed in each of the partitions 11, the functional component groups 30 include the first functional components 31, part of the first functional components 31 are multiplexed as the first alignment marks 311, and the shapes of the first alignment marks 311 are different from the shapes of another part of the first functional components 31.

Specifically, the first functional components 31 can be one or more of functional components such as a fingerprint recognition sensor, a palmprint recognition sensor, an energy storage capacitor, or an antenna, etc.

Figure 10:
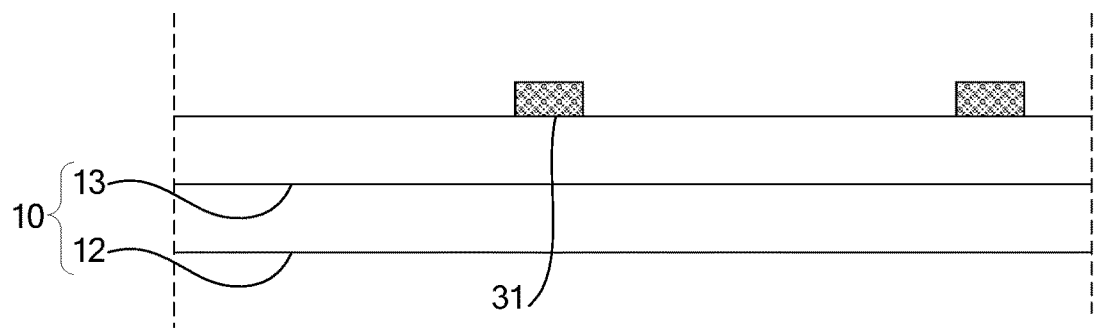

Specifically, taking the first functional component 31 as the fingerprint recognition sensor as an example for description. As illustrated in FIG. 10, the driving circuit 10 includes the base 12 and the driving circuit layer 13 disposed on the base 12. The first functional components 31 are disposed on the driving circuit layer 13. The driving circuit layer 13 includes a driving circuit (not shown in the figure) configured to drive the micro-LED chips and a driving circuit (not shown in the figure) configured to drive the fingerprint recognition sensors. Active matrix driving technology or passive matrix driving technology based on a-Si, LTPS, IGZO, etc. is used in the driving circuit for implementation. The fingerprint recognition sensors are disposed above the corresponding driving circuit.

Furthermore, a number of the partitions 11 divided on the driving backplate 10 is equal to a number of required mass transfers. Dimensions of lengths and widths of the partitions 11 range from 2 centimeters to 3 centimeters, and the dimensions of each partition 11 are same, which is conducive to using a uniform method for alignment, transfer, and binding, thereby simplifying manufacturing processes.

Furthermore, at least two first functional components are multiplexed as the first alignment marks 311 in each partition 11. The first alignment marks 311 are the fingerprint recognition sensors and are multiplexed as the alignment marks at same time. The shapes of the first alignment marks 311 are cross shapes, and of course can be configured to be other mark shapes. The first functional components 31 not multiplexed as the first alignment marks are configured into rectangular shapes, such as rectangular shapes, etc.

Furthermore, the mark shapes of the first alignment marks 311 include one or more of a circle, a rectangular shape, or a cross shape, or combinations thereof. The shapes of the first alignment marks 311 illustrated in FIG. 9 are the cross shapes.

Furthermore, at least two first alignment marks 311 in each partition are disposed on the two diagonal sides of the partition 11, and the two first alignment marks 311 are symmetrical about a center of the partition 11. Of course, the first alignment marks 311 can also be disposed on other regions of the partitions, where can meet alignment requirements.

Furthermore, the shapes of the two first alignment marks 311 can also be different to improve alignment accuracy.

Step 20, providing a transfer substrate disposed with the micro-LED chips, taking the first alignment marks as references to transfer the micro-LED chips into each of the partitions by stages, and binding the micro-LED chips to the driving backplate.

Figure 11:
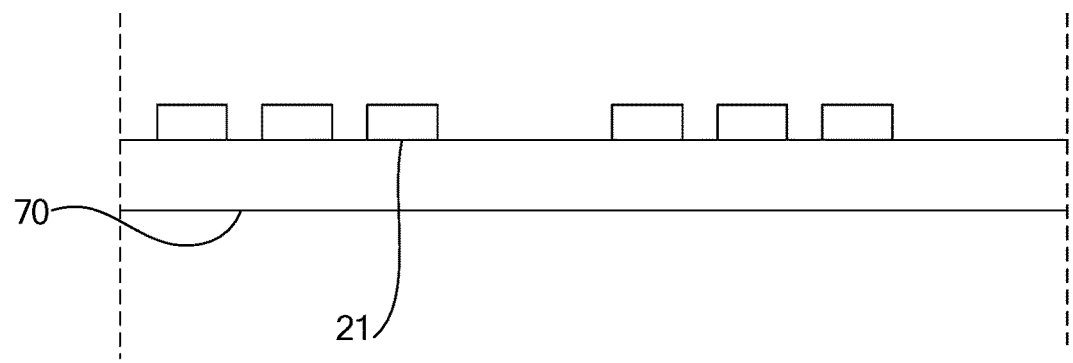

Specifically, as illustrated in FIG. 11, the micro-LED chips 21 on the transfer substrate 70 can be micro-LED chips with three primary colors of red, green, and blue, or can be micro-LED chips with a same color and can be coordinated with quantum dot layers or fluorescent powders to realize display of three primary colors.

Furthermore, the micro-LED chips 21 can be structures of light emission from a bottom surface or light emission from an electrode surface.

Furthermore, widths and lengths of the micro-LED chips 21 range from 1 μm to 100 μm, and heights of the micro-LED chips 21 range from 1 μm to 20 μm.

Figure 12:
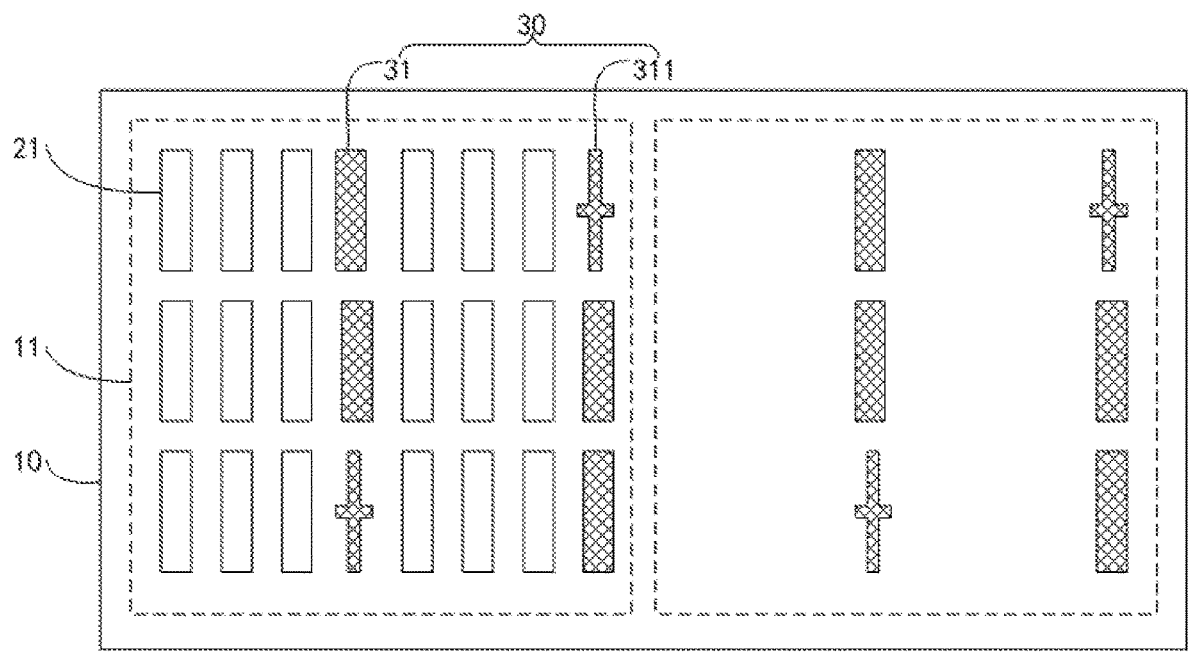
Figure 13:
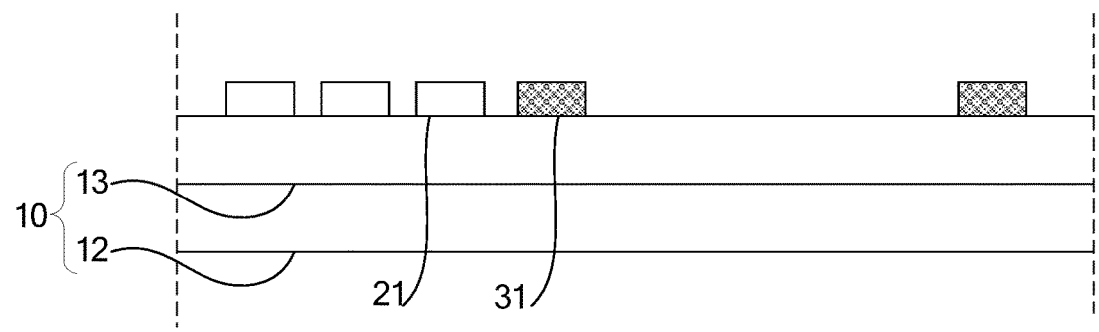

Specifically, taking the first alignment marks 311 in the partitions 11 as references, the micro-LED chips 21 on the transfer substrate 70 are transferred to the corresponding partitions 11 by mass transfer technology and are bound on the driving backplate 10 to realize electrical connection to the corresponding driving circuit on the driving backplate 10, forming a structural bottom schematic view illustrated in FIG. 12 and a lateral schematic view of a layer structure illustrated in FIG. 13, so that a transfer of the micro-LED chips on one partition is completed.

Furthermore, the other micro-LED chips on the transfer substrates are transferred to each partition by stages by repeating the processes of alignment, transferring, binding mentioned above.

Figure 14:
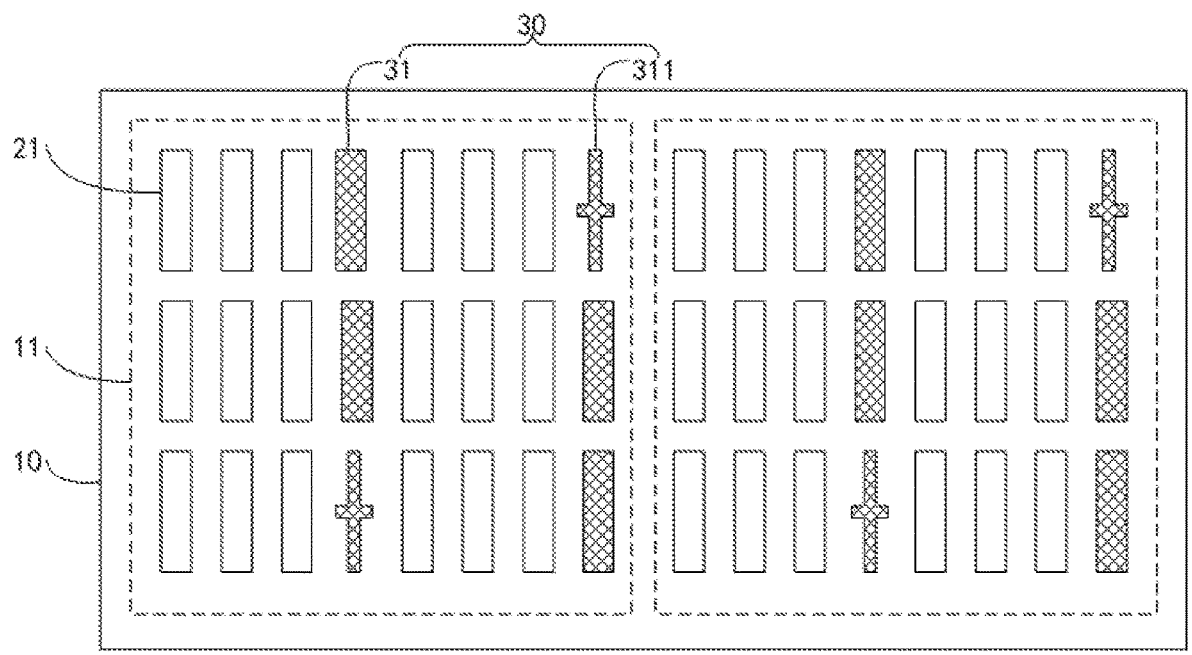
Figure 15:
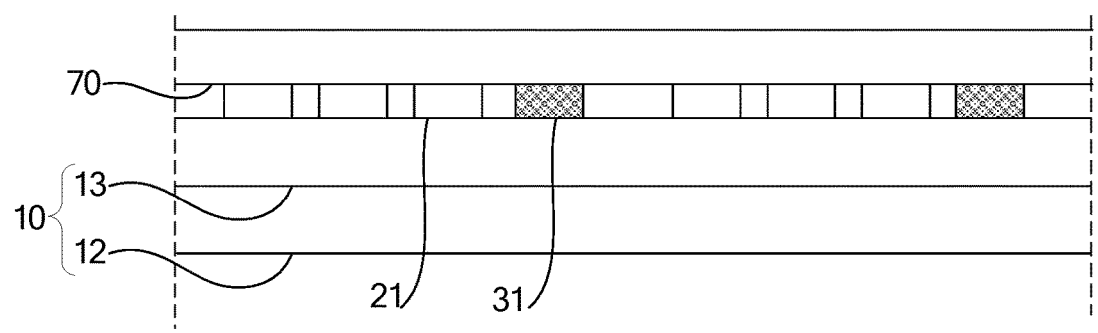

Specifically, all the micro-LED chips 21 are transferred to each partition 11 on the driving backplate 10 by stages by using a uniform mass transfer manner to align, transfer, and bind to form a structural bottom schematic view illustrated in FIG. 14 and a lateral schematic view of a layer structure illustrated in FIG. 15.

Figure 16:
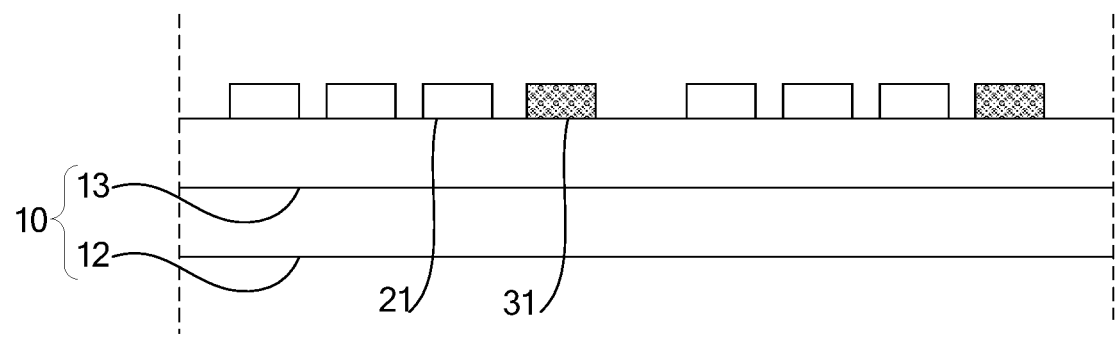

Step S30, peeling off the transfer substrate to form a structure illustrated in FIG. 16.

Figure 17:
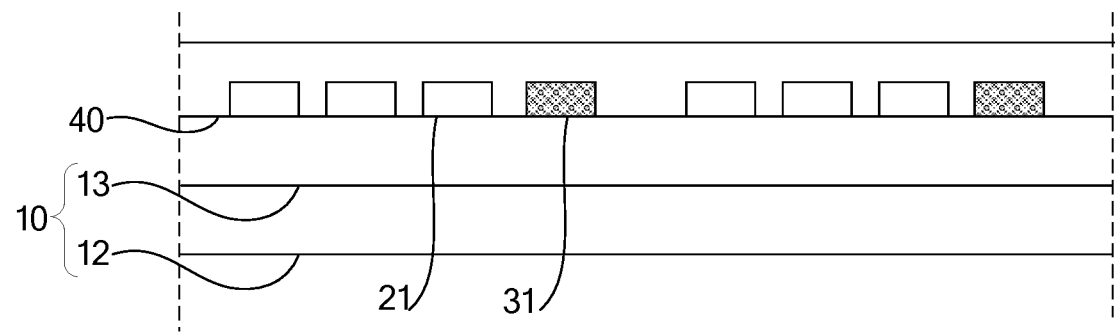

Step S40, manufacturing an encapsulation layer 40 on the micro-LED chips and the first functional components to form a structure as illustrated in FIG. 17.

Specifically, after completing the mass transfer of all the partitions 11, one encapsulation layer 40 is manufactured on the micro-LED chips and the fingerprint recognition sensor. The encapsulation layer is a high level difference absorbing encapsulation layer configured to balance level differences between each of the micro-LED chips while protecting the micro-LED chips to prevent intrusion of water/oxygen.

Furthermore, a light path layer is disposed on the encapsulation layer, and light transmissive regions are disposed on the light path layer. As illustrated in FIG. 3, the light transmissive regions correspond to the fingerprint recognition sensors one by one.

Figure 18:
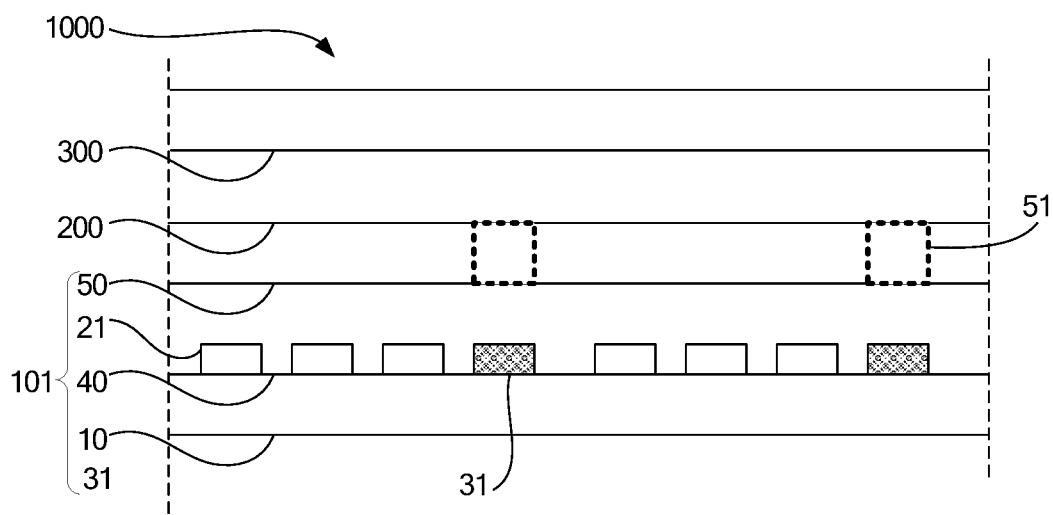
FIG. 18 is a lateral structural schematic diagram of a display device provided by one embodiment of the present disclosure.

In one embodiment, as illustrated in FIG. 18, a display device is provided. The display device 1000 includes the display panel 101 in one of the embodiments mentioned above, and a transparent bonding layer 200 and a cover plate 300 disposed on the display panel 101. Furthermore, the display panel 101 includes the driving backplate 10, the micro-LED chips 21 and the first functional components 31 disposed on the driving backplate 10, the encapsulation layer 40, the light path layer 50, and the light transmissive region 51 disposed on the light path layer 50. Furthermore, the first functional components 31 are multiplexed as the first alignment marks.

According to embodiments mentioned above, it can be understood that:

The present disclosure provides the display panel, the manufacturing method thereof, and the display device. The display panel includes the driving backplate, the functional component groups and the alignment marks disposed on the driving backplate, the micro-LED chips bound on the driving backplate, and the encapsulation layer disposed on the micro-LED chips and the functional component groups. The functional component groups are integrated in the regions in the pixel units where the micro-LED chip is not disposed, and part of the functional component groups are disposed in the shape easy to be recognize for acting as the alignment marks. By integrating the functional components into the pixel units, integration of the display panel is improved. Furthermore, the shapes of part of the functional components are made into the shapes of the alignment marks, which can be multiplexed as the alignment marks during the mass transfer, and other functional components not multiplexed as the marks are kept in a design with maximized area. Therefore, there is no need to occupy additional pixel space for independently manufacturing the mass transfer alignment marks, which can ensure areas of the integrated functional components to be maximized. Moreover, design degree of freedom of each display subpixel units can be increased, which is conducive to increasing space of the subpixel units, thereby realizing high PPI display.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A display panel, comprising:
a plurality of subpixel units; and
functional component groups disposed between adjacent subpixel units, wherein a function of the functional component groups is different from a function of the subpixel units, the functional component groups comprise first functional components, and the first functional components are multiplexed as first alignment marks.

2. The display panel as claimed in claim 1, wherein each of the subpixel units comprises micro light emitting diode (micro-LED) chips, and the functional component groups are disposed between two adjacent micro-LED chips.

3. The display panel as claimed in claim 2, wherein the display panel comprises a driving backplate and an encapsulation layer, the micro-LED chips are bound on the driving backplate, the encapsulation layer is covered on the micro-LED chips, the driving backplate is divided into a plurality of partitions, and each of the partitions comprises the plurality of subpixel units.

4. The display panel as claimed in claim 3, wherein at least two of the first functional components in each of the partitions are multiplexed as the first alignment marks.

5. The display panel as claimed in claim 4, wherein the at least two of the first functional components are located on diagonal sides of the partition.

6. The display panel as claimed in claim 4, wherein shapes of the at least two of the first functional components are different.

7. The display panel as claimed in claim 1, wherein part of the first functional components are multiplexed as the first alignment marks, and shapes of the first alignment marks are different from shapes of another part of the first functional components.

8. The display panel as claimed in claim 1, wherein the functional component groups comprise second functional components adjacent to the first functional components, and a function of the second functional components is different from a function of the first functional components.

9. The display panel as claimed in claim 8, wherein the second functional components are multiplexed as second alignment marks.

10. The display panel as claimed in claim 9, wherein shapes of the second functional components are different from shapes of the first functional components.

11. The display panel as claimed in claim 9, wherein shapes of the first alignment marks and the second alignment marks comprise one or more of a circle, a rectangular shape, or a cross shape, or combinations thereof.

12. The display panel as claimed in claim 11, wherein diameters or edges of the first alignment marks and the second alignment marks are respectively greater than 30 μm.

13. The display panel as claimed in claim 8, wherein the second functional components and the first functional components are multiplexed as the first alignment marks.

14. The display panel as claimed in claim 8, wherein each of the first functional components and the second functional components comprises one functional component of a fingerprint recognition sensor, a palmprint recognition sensor, an energy storage capacitor, or an antenna.

15. A manufacturing method of a display panel, comprising following steps:
providing a driving backplate, wherein the driving backplate is divided into a plurality of partitions, functional component groups are disposed in each of the partitions, the functional component groups comprise first functional components, part of the first functional components are multiplexed as first alignment marks, and shapes of the first alignment marks are different from shapes of another part of the first functional components;
providing a transfer substrate disposed with micro light emitting diode (micro-LED) chips, taking the first alignment marks as references to transfer the micro-LED chips into each of the partitions by stages, and binding the micro-LED chips to the driving backplate;
peeling off the transfer substrate; and
manufacturing an encapsulation layer on the micro-LED chips and the first functional components.

16. The manufacturing method of the display panel as claimed in claim 15, wherein at least two of the first functional components in each of the partitions are multiplexed as the first alignment marks, the at least two of the first functional components are disposed on diagonal sides of the partition, and shapes of the at least two of the first functional components are different.

17. A display device, comprising a display panel, wherein the display panel comprises:
a plurality of subpixel units; and
functional component groups disposed between adjacent subpixel units, wherein a function of the functional component groups is different from a function of the subpixel units, the functional component groups comprise first functional components, and the first functional components are multiplexed as first alignment marks.

18. The display device as claimed in claim 17, wherein the functional component groups comprise second functional components adjacent to the first functional components, and a function of the second functional components is different from a function of the first functional components.

19. The display device as claimed in claim 18, wherein the second functional components are multiplexed as second alignment marks.

20. The display device as claimed in claim 18, wherein the second functional components and the first functional components are multiplexed as the first alignment marks.

* * * * *